United States Patent
Ishitsuka et al.

(10) Patent No.: US 6,348,396 B1
(45) Date of Patent: Feb. 19, 2002

(54) SEMICONDUCTOR DEVICE AND PRODUCTION THEREOF

(75) Inventors: Norio Ishitsuka, Ibaraki-ken; Hideo Miura, Koshigaya; Shuji Ikeda, Koganei; Yasuko Yoshida, Sayama, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/702,786

(22) Filed: Nov. 1, 2000

Related U.S. Application Data

(62) Division of application No. 09/276,835, filed on Mar. 26, 1999.

(30) Foreign Application Priority Data

Mar. 27, 1998 (JP) .......................................... 10-080812

(51) Int. Cl.[7] .............................................. H01L 21/76
(52) U.S. Cl. ...................... 438/424; 438/425; 438/423
(58) Field of Search ................................. 438/424, 221, 438/297, 697, 425, 435, 437, 296, 276, 278, 423, 449, 585, 587; 257/390, 391

(56) References Cited

U.S. PATENT DOCUMENTS

| | | |
|---|---|---|
| 5,244,827 A | 9/1993 | Dixit et al. |
| 5,298,780 A | 3/1994 | Harada |
| 5,338,958 A * | 8/1994 | Mitsumoto ................... 257/330 |
| 5,766,971 A * | 6/1998 | Ahlgren ........................ 437/67 |
| 5,801,083 A | 9/1998 | Yu et al. |
| 5,854,114 A | 12/1998 | Li et al. |
| 5,956,598 A * | 9/1999 | Huang et al. ................. 438/424 |
| 6,090,684 A * | 7/2000 | Ishitsuka et al. ............. 438/424 |
| 6,091,119 A * | 7/2000 | Wu ............................. 257/390 |
| 6,133,102 A * | 10/2000 | Wu ............................. 438/276 |
| 6,146,972 A * | 11/2000 | Yamamoto ................... 438/425 |

FOREIGN PATENT DOCUMENTS

| | | |
|---|---|---|
| EP | 0776036 | 11/1996 |
| JP | 60161632 | 8/1985 |
| JP | 4-303942 | 10/1992 |
| JP | 7-335735 | 12/1995 |
| JP | 10-56058 | 2/1998 |

OTHER PUBLICATIONS

Nag et al., "Comparative Evaluation of Gap–Fill Dielectrics in Shallow Trench Isolation for Sub–0.25$\mu$m Technologies", Tech. Dig. of IEEE, 1996, pp. 841–844.

\* cited by examiner

*Primary Examiner*—Charles Bowers
*Assistant Examiner*—Laura M Schillinger
(74) *Attorney, Agent, or Firm*—Antonelli, Terry, Stout & Kraus, LLP

(57) ABSTRACT

A semiconductor device having a SGI structure produced by selecting D, T and R values for satisfying the formula:

$$D < 0.4^{(-100R+7)-1}(-230\,T+14.5),$$

wherein D is a width of an element formation region, T is a thermal oxidation amount of a groove in terms of microns, and R is a curvature radius at an end bottom portion of the groove, has excellent properties such as reduced in stress generated at bottom portions of grooves in a silicon substrate and not generating abnormal junction leakage current.

2 Claims, 5 Drawing Sheets

SEMICONDUCTOR DEVICE AND PRODUCTION THEREOF

CROSS-REFERENCE TO RELATED APPLICATION

This application is a divisional of application Ser. No. 09/276,835, filed on Mar. 26, 1999, the entire disclosure of which is hereby incorporated by reference.

BACKGROUND OF THE INVENTION

This invention relates to a semiconductor device having a groove isolation structure with high reliability, and a process for producing the same.

As a process for electrically insulating isolation of adjacent elements on a semiconductor substrate, it is known a shallow groove isolation (SGI) process. According to the SGI process, shallow grooves are formed on a silicon substrate, followed by burying an oxide film thereinto by a chemical vapor deposition (CVD) method or a sputtering method. Since the SGI process has higher processing dimensional accuracy than a LOCOS structure conventionally used, it can provides a structure suitable for devices after a 0.25 μm process. But according to the SGI structure, since a burying oxide film is produced by a CVD method or a sputtering method, it has a density generally coarser than a thermally oxidized film (hereinafter referred to as "thermal oxide film"). Thus, about 5% shrinkage takes place during a subsequent thermal treatment step, resulting in formation of a void-like "cavity" at the interface of the oxide film even by slight etching using dilute hydrofluoric acid.

FIG. 2 is a cross-sectional view showing such a "cavity", wherein numeral 1 denotes a silicon substrate, numeral 6 a burying insulating film or layer, and numeral 3 the "cavity".

When such a "cavity" is present, a wiring film or the like remains in the cavity at the time of patterning after a step of wiring and a deposition of an electrode film, resulting in often causing electrically undesirable phenomena such as short-circuit, etc.

In order to remove such a "cavity", S. Nag et al disclose in Tech. Dig. of IEEE, 1996, p. 841–844 that after burying a burying oxide film, thermal treatment is conducted in an oxidizing atmosphere to change Si in a groove into $SiO_2$ for reducing the volume, resulting in removing the "cavity".

But, according to this method, there arises an disadvantage in that a high mechanical stress is generated in the groove and adjacent silicon substrate portions due to about twice volume expansion of the oxide film as a side action of removal of "cavity".

SUMMARY OF THE INVENTION

It is an object of the present invention to provide a semiconductor device having high reliability by making a generated stress lower than a critical stress and preventing generation of crystal defects or an increase of a junction leakage current, and a process for producing the same.

The present invention provides a semiconductor device comprising a semiconductor substrate having a plurality of element formation regions and element isolation regions on a main surface thereof, each element isolation region comprising a groove formed in the semiconductor substrate, a thermal oxide film formed on the wall surface of the groove, and an insulating material buried in the groove, said thermal oxide film being formed while satisfying the formula:

$$D < 0.4^{(-100R+7)^{-1}}(-230\,T + 14.5) \qquad (1)$$

wherein D is a width of the element formation region (or active width); T is a thermal oxidation amount (thermal oxide film thickness) of the groove in terms of microns; and R is a curvature radius at an end bottom portion of the groove, provided that T is 0.01 μm or more.

The present invention also provides a process for producing a semiconductor device having a plurality of element formation regions and element isolation regions on a main surface of a semiconductor substrate, which comprises the steps of:

(a) forming a pad oxide film and a silicon nitride film on a semiconductor substrate, and removing a part of the semiconductor substrate from the portions wherein the element isolation regions are to be formed to form grooves, each groove having a curvature radius R at an end bottom portion of the groove, (b) burying an insulating film in each groove to form a burying insulating film, (c) forming a thermal oxide film on the wall surface of each groove while satisfying the following formula:

$$D < 0.4^{(-100R+7)^{-1}}(-230\,T + 14.5) \qquad (1)$$

wherein D is a width of the element formation region (or active width); T is a thermal oxidation amount of the groove in terms of microns; and R is a curvature radius at the end bottom portion of the groove, provided that T is 0.01 μm or more, and (d) removing said burying insulating film, said silicon nitride film and said pad oxide film.

DETAILED DESCRIPTION OF THE INVENTION

The present inventors have noticed causes for generating defects in the process for producing a semiconductor device having a groove isolation structure by the SGI process mentioned above, particularly mechanical scheme for generating high mechanical stress in the inside of the groove and neighboring portions in the silicon substrate, and studied how to remove such defects.

As a result, it was found that at end bottom portions of a groove, high stress was generated due to interference of volume expansion of the oxide film at the bottom of the groove and the side wall of the groove. Further, with an increase of the oxidation amount, this stress increased and often generated crystal defects such as dislocation in the silicon substrate. It was also found that when such crystal defects were generated in the transistor region, for example, there often caused an increase of junction leakage current.

The present inventors found from various experiments that when an oxidation amount was constant, the crystal defects easily took place when the active width D (the distance between neighboring element isolation regions, that is, the width of element formation region) was large. Further, from a finite element method analysis simulating the above experiments, it was found that when the active width became larger, the stress generated also became larger, resulting in causing an increase of the junction leakage current at a certain critical stress or more. Thus, the present invention has been accomplished.

Production of Semiconductor Device Having Groove Isolation Structure

One example of producing a semiconductor device having a groove isolation structure is explained by the following steps (a) to (h) referring to FIGS. 3A to 3G.

Figure 3A:
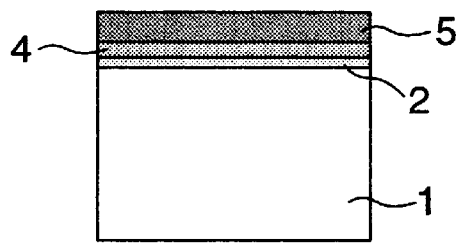
FIGS. 3A to 3G are cross-sectional views explaining one example of the process of the present invention for producing the semiconductor device.

(a) A surface of a silicon substrate 1 is thermal oxidized to form a pad oxide film 2 with about 10 nm thick [FIG. 3A].

(b) On the pad oxide film 2, a silicon nitride film 4 having a thickness of about 150 nm is deposited [FIG. 3A].

(c) On the silicon nitride film 4, a photoresist 5 is formed [FIG. 3A].

Figure 3B:
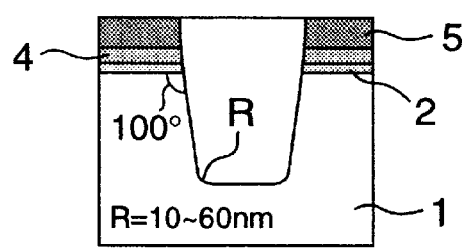

(d) After removing the photoresist 5 on desired portions by a conventional light exposure method, a part of the silicon nitride film 4, a part of the pad oxide film 2, and a part of the silicon substrate 1 are removed by etching to form a shallow groove having an angle of about 100° at the upper end of the groove wall against the silicon substrate 1 [FIG. 3B]. At this time, a curvature radium R of about 50–60 nm or less is formed at an end portion of the groove.

Figure 3C:
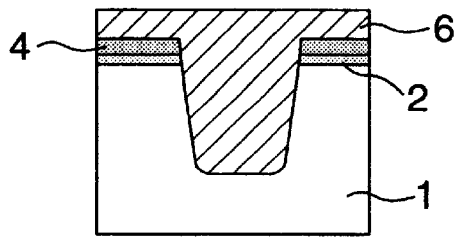

(e) An insulating film such as a silicon oxide film (or a second silicon oxide film) is deposited by a chemical vapor deposition (CVD) method, a sputtering method, or the like and buried in the inside of the groove (hereinafter referred to as "burying insulating film" 6) [FIG. 3C].

Figure 3D:
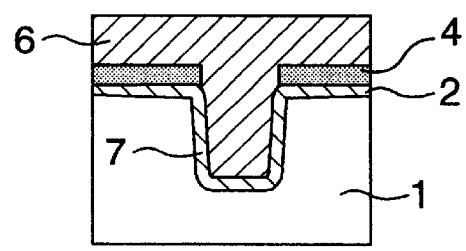

(f) After depositing the burying insulating film 6, the silicon substrate 1 is subjected to oxidation at a temperature of about 1000° C. in an oxidative atmosphere to conduct oxidation in the range of 10 to 65 nm in terms of the thickness of the resulting thermal oxide film 7 (or the first silicon oxide film), since the silicon oxide film produced by the CVD method or the sputtering method is generally a rough film [FIG. 3D].

Figure 3E:
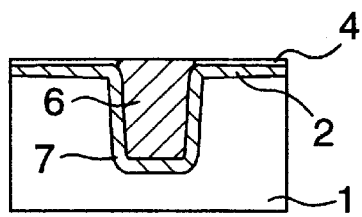
Figure 3F:
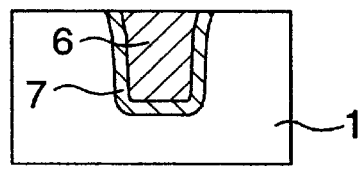

(g) An excess portion of the burying insulating film 6 is etch backed using a chemical mechanical polishing (CMP) method or a dry etching method [FIG. 3E]. In this case, the silicon nitride film 4 used as an oxidation preventing film acts as an etching stopper to prevent the silicon substrate 1 under the silicon nitride film 4 from etching [FIG. 3F].

(h) After removing the silicon nitride film 4 and the pad oxide film 2, the groove burying structure is completed.

Figure 3G:
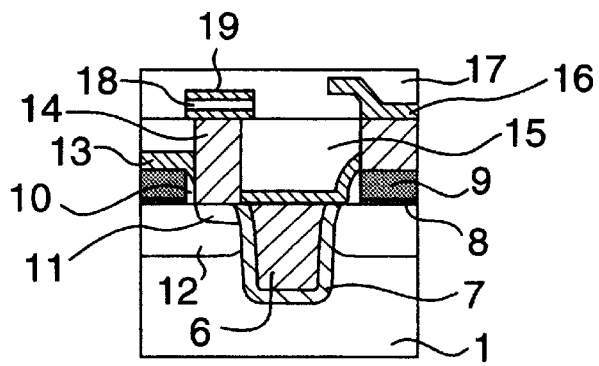

Then, a thermal oxide film 8, a gate electrode 9, a condenser electrode 19, a wiring 16, insulating films 15 and 17, etc. are formed thereon to complete the semiconductor device [FIG. 3G].

In FIG. 3G, numeral 10 denotes a side wall, numeral 11 a drain or source layer, numeral 12 a well layer, numeral 13 an insulating film, numeral 14 a plug, and numeral 18 a dielectric material film.

Relation between Active Width and Properties

The semiconductor thus produced was subjected to examination of a relation between the active width (the width of element formation region) D and physical properties such as junction leakage current and shear stress.

TABLE 1

| Oxidation | Active width | | | |
|---|---|---|---|---|
| time | 2 μm | 4 μm | 8 μm | 16 μm |
| 5 min. | ○ | ○ | X | X |
| 10 min. | X | X | X | X |

Figure 4:
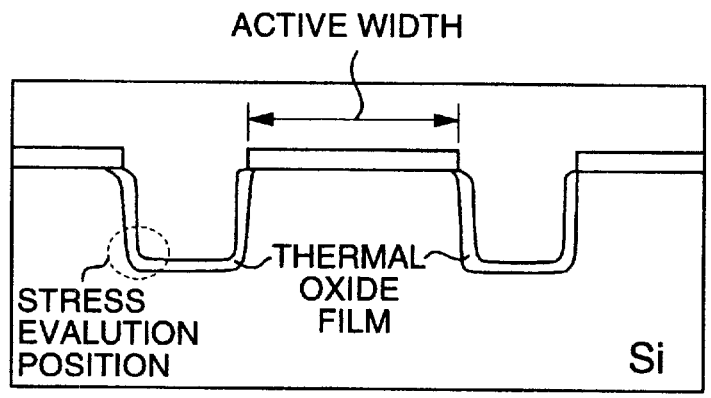
FIG. 4 is a cross-sectional view for explaining the active width and the stress evaluation portion of a semiconductor device of the present invention.

Table 1 shows the results of the active width dependency of junction leakage current when the oxidation time for the silicon substrate in the step (f) mentioned above [FIG. 3D] at 1000° C. in an oxidative atmosphere is changed to 5 minutes and 10 minutes so as to change the active width of the MOS type transistor [see FIG. 4].

In Table 1, the mark ○ means that the junction current value is a permissible value or less, and the mark X means that the junction current value is over the permissible value.

As shown in Table 1, abnormal junction leakage current is generated when the active width is 8 μm or more in the case of oxidation time of 5 minutes. In the case of oxidation time of 10 minutes, abnormal junction leakage current is generated in all the active width.

Figure 5:
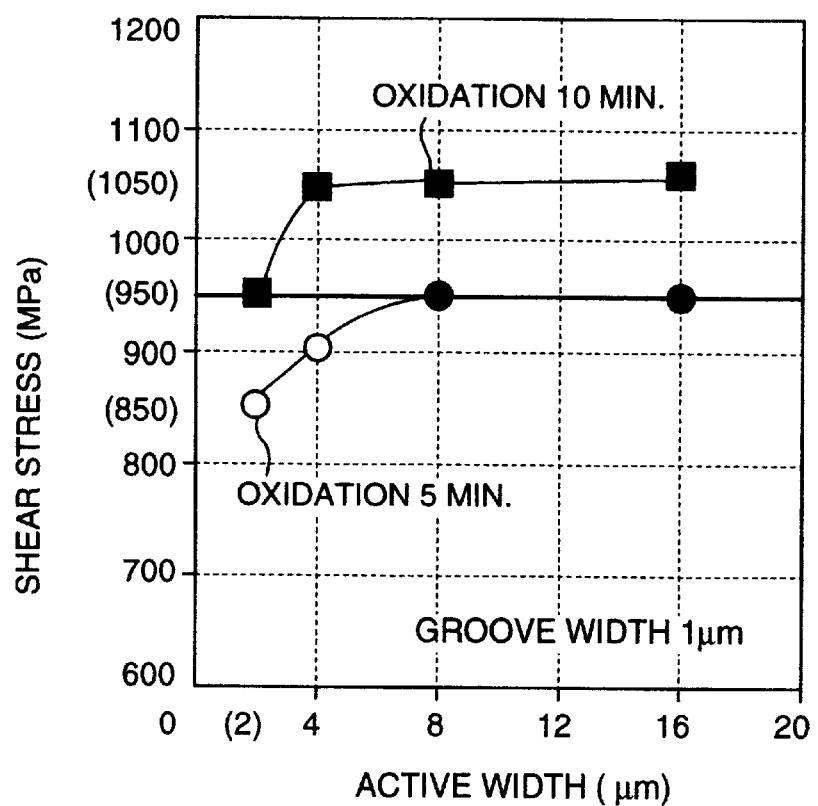
FIG. 5 is a graph showing a relationship between the shear stress and the active width of a semiconductor device of the present invention.

Next, shear stress generated in the silicon substrate when the groove width was 1 μm was simulated and shown in FIG. 5. In FIG. 5, the abscissa axis shows an active width, and the ordinate axis shows shear stress at the end bottom portion of the groove. The stress evaluation position is shown in FIG. 4, which position is near the R portion at an end bottom portion of the groove.

In FIG. 5, the oxidation time of 5 minutes is shown by ○ and ●, and the oxidation time of 10 minutes is shown by ■, wherein the mark ○ means that no abnormal junction leakage current is generated, and the marks ● and ■ mean that abnormal junction leakage current is generated.

As is clear from the results of FIG. 5, the generation of stress is dependent on the active width, and the active width becomes larger, the stress generated becomes larger. For example, when the oxidation time is 5 minutes, the shear stress becomes 850 MPa at the active width of 2 μm, 900 MPa at the active width of 4 μm and 950 MPa at the active width of 8 μm. When the oxidation time is 10 minutes, the shear stress is 950 MPa at the active width of 2 μm, and 1050 MPa at the active width of 4 μm or more. Further, from the plots ● and ■ which mean generation of abnormal junction leakage current as shown in Table 1, it is admitted that abnormal junction leakage current takes place at the generation of shear stress of about 950 MPa.

Relation among Active Width, Curvature Radius, and Thermal Oxidation Amount

The active width D, the curvature radius R at the end bottom portion of groove, and the thermal oxidation amount T (thermal oxide film thickness) at the inner walls of the groove seem to be factors deciding the shear stress in the semiconductor having a SGI structure. Thus, the stress generated at the end bottom portion of the groove in the silicon substrate was analyzed by simulation by varying these factors variously to obtain the relation when the shear stress is over 950 MPa.

Figure 1A:
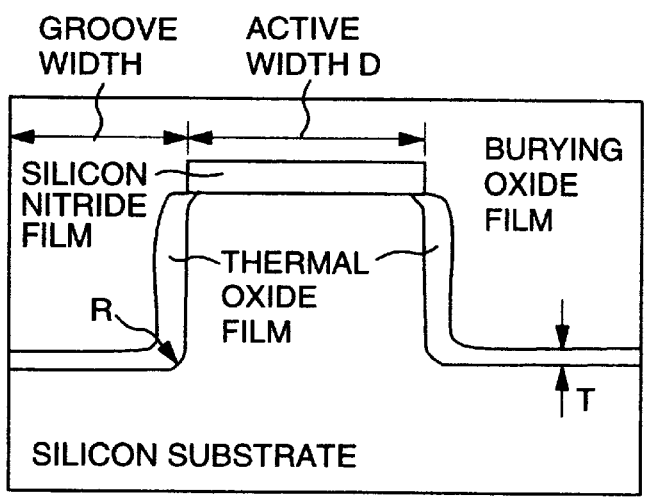
FIG. 1A is a cross-sectional view for explaining the active width D, the curvature radius R at an end bottom portion of the groove; and the thermal oxidation amount T in terms of microns.
Figure 1B:
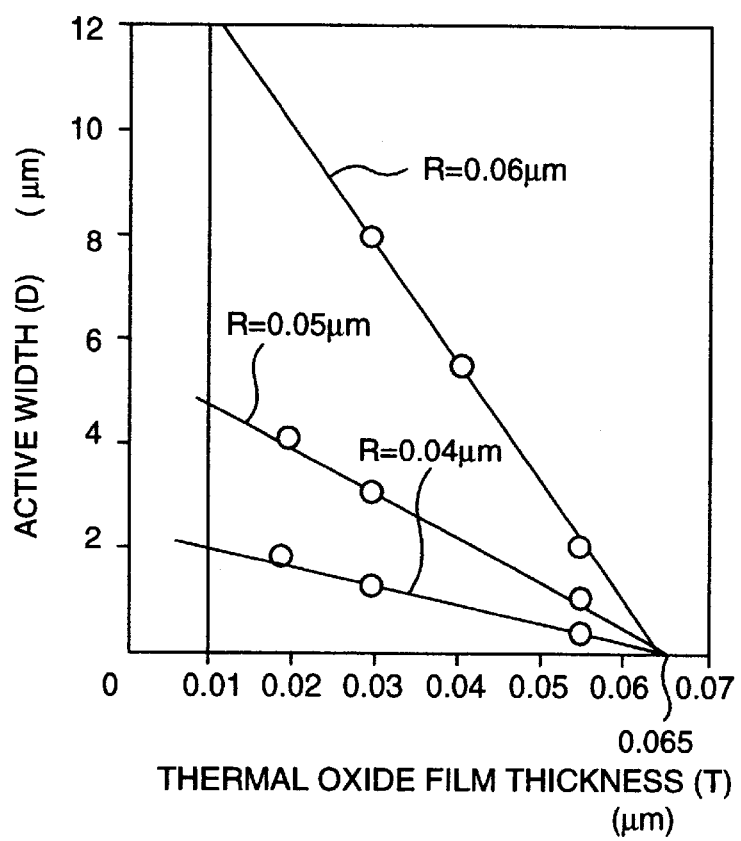
FIG. 1B is a graph showing a relationship between the thermal oxidation amount T (μm) and the active width D (μm).
Figure 2:
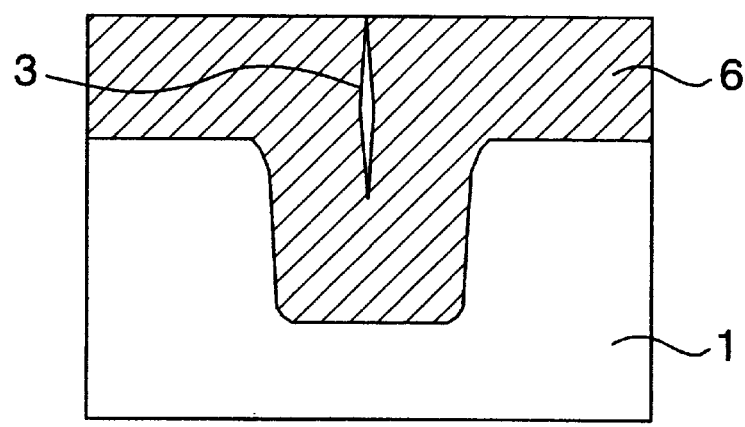
FIG. 2 is a cross-sectional view for explaining a problem of prior art process.

The results are shown in FIG. 1B, wherein the abscissa axis shows the thermal oxide film thickness (T) and the ordinate axis shows the active width (D). In FIG. 1B, the results of the curvature radius R of 0.04 µm to 0.06 µm are shown. Further, the thermal oxide film thickness is taken from the value at the central portion of the groove width.

The regions wherein abnormal junction leakage current takes place are the regions above each linear line having larger active width. From FIG. 1B, it is recognized that with an increase of the oxidation amount, permissible active width becomes smaller, and with an decrease of the curvature radius, the permissible active width also becomes smaller.

The relation among the active width D (µm), the thermal oxide film thickness T (µm) and the curvature radius R (µm) at the end bottom portion of the groove shown in FIG. 1A is examined to obtain the following formula (1):

$$D < 0.4^{(-100R+7)-1}(-230\,T+14.5) \tag{1}$$

On the other hand, it is known experientially that the thermal oxidation amount T should be 0.01 µm or more in order to remove the "cavity" from the burying oxide film. Therefore, in the above formula (1), the thermal oxide film thickness T should be 0.01 µm or more in order to prevent the increase of junction leakage current in the semiconductor device having the SGI structure.

Thus, the values of D, T and R should be determined to satisfy the formula (1) mentioned above.

The formula (1) is effective not only in the case of densified oxidation mentioned above, but also in the subsequent oxidations.

Figure 6:
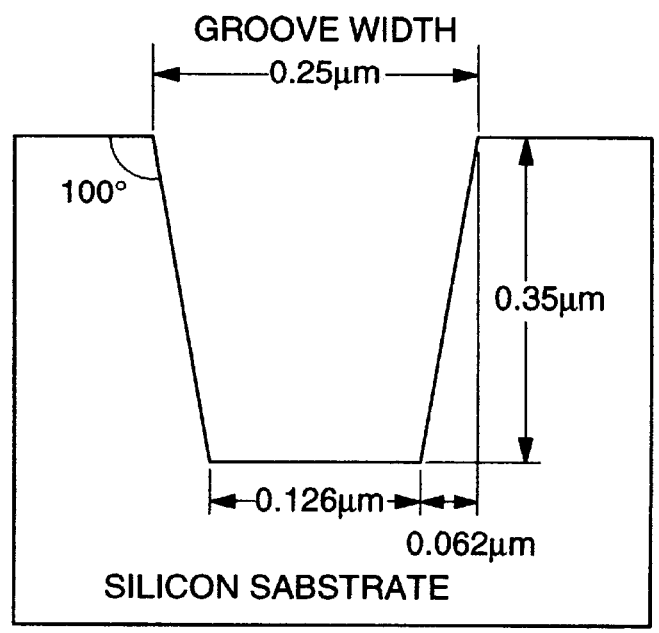
FIG. 6 is a cross-sectional view of one example of the semiconductor device of the present invention.

In the case of element isolation with the groove width of 0.25 µm or less as shown in FIG. 6, the angle of the groove against the surface of silicon substrate becomes about 100° substantially considering the coverage of the burying oxide film 6. Further, the depth of the groove is about 0.35 µm. From these values, the length at the bottom of the groove becomes about 0.126 µm. Thus, it becomes impossible to make the curvature radius R at the end bottom portion of the groove substantially 0.063 µm or more. From this value, the permissible active width (D) is calculated using the formula (1) to be about 16 µm, when the minimum oxidation amount (T) is 0.01 µm. In addition, permissible thermal oxidation amount (T) becomes 0.01 µm or more and less than 0.065 µm from FIG. 1B.

Figure 7:
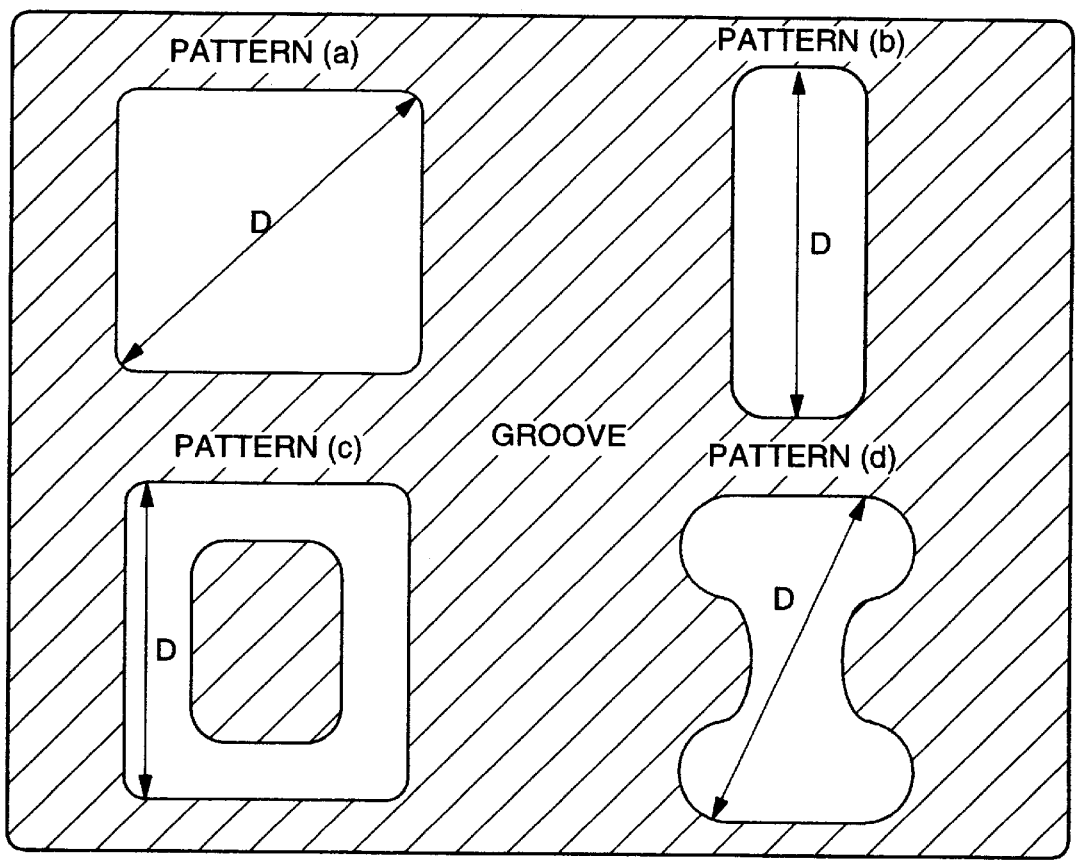
FIG. 7 is a plan view for explaining the definition of the active width in various embodiments in the present invention.

The element formation region in the present invention can take various shapes as shown in FIG. 7. In any case, the active width (D) means the maximum length in any shapes as shown in FIG. 7, for example.

The lower limit of the active width (D) is the minimum processing size, which is, for example, 0.25 µm or more in general, but it is not impossible to be 0.1 µm or 0.05 µm.

The present invention is illustrated by way of the following Examples.

EXAMPLE 1

On a silicon substrate, a pad oxide film of about 10 nm thick was formed by thermal oxidation at 800° C., followed by deposition of a silicon nitride film of about 150 µm thereon by a conventional method. A photoresist was formed on the silicon nitride film, and the photoresist was removed from the desired portions by a conventional light exposure method. Then, the silicon nitride film, the pad oxide film and a part of the silicon substrate under the removed photoresist were removed by etching to form shallow grooves. The curvature radius at the end bottom portion of the groove (R) was 0.05 µm.

Then, a silicon oxide film was deposited in the grooves by a CVD method to form a burying insulating film. Oxidation was carried out at about 1000° C. in an oxidative atmosphere to form a thermal oxide film on the inner walls of the grooves.

The upper portion of the burying insulating film above the groove was etch backed by a CMP method, followed by removal of the silicon nitride film and the pad oxide film to complete a groove burying structure. Thereafter, gate electrodes, condenser electrodes, wirings, insulating film were formed thereon to give a semiconductor device shown in FIG. 3G. The active width (D) was 2 µm, the thermal oxidation amount (thermal oxide film thickness) in the groove (T) was 0.03 µm. The values of R, T and D satisfied the formula (1) and no "cavity" was formed. There arose no problem at the time of patterning after formation of wirings and the electrodes. The junction leakage current was below the permissible value.

COMPARATIVE EXAMPLE 1

A semiconductor device was produced in the same manner as described in Example 1 except for making R 0.05 µm, D 18 µm and T 0.03 µm.

The thus produced semiconductor device generated abnormal junction leakage current.

As mentioned above, according to the present invention, the semiconductor device having a groove isolation structure without leakage current abnormal can be produced easily and precisely.

What is claimed is:

1. A process for producing a semiconductor device having a plurality of element formation regions and element isolation regions on a main surface of a semiconductor substrate, which comprises the steps of:

(a) forming a pad oxide film and a silicon nitride film on a semiconductor substrate, and removing a part of the semiconductor substrate from the portions wherein the element isolation regions are to be formed to form grooves, each groove having a curvature radius R at an end bottom portion of the groove, (b) burying an insulating film in each groove to form a burying insulating film, (c) forming a thermal oxide film on the wall surface of each groove while satisfying the following formula:

$$D < 0.4^{(-100R+7)-1}(-230\,T+14.5) \tag{1}$$

wherein D is a width of the element formation region; T is a thermal oxidation amount of the groove in terms of microns; and R is a curvature radius at an end bottom portion of the groove, provided that T is 0.01 µm or more, and (d) removing said burying insulating film, said silicon nitride film and said pad oxide film.

2. A process for producing a semiconductor device having a plurality of element formation regions and element isolation regions on a main surface of a silicon substrate, which comprises the steps of:

(a) forming a pad oxide film by thermal oxidation on a main surface of the silicon substrate, (b) forming a silicon nitride film on the pad oxide film,
(c) forming a photoresist on the silicon nitride film,
(d) removing the photoresist film from the portions wherein said element isolation regions are to be formed, and also removing a part of the silicon nitride film, a part of the pad oxide film and a part of the silicon substrate from said portions to form each groove having a curvature radius R at an end bottom portion of the groove,
(e) burying an insulating material in the groove to form a burying insulating film,
(f) forming a thermal oxide film on the wall surface of each groove while satisfying the following formula:

$$D < 0.4^{(-100R+7)-1}(-230\,T+14.5) \tag{1}$$

wherein D is a width of the element formation region; T is a thermal oxidation amount of the groove in terms of microns; and R is a curvature radius at an end bottom portion of the groove, provided that T is 0.01 $\mu$m or more, and (g) removing excess burying insulating film, and
(h) removing the silicon nitride film and the pad oxide film.

* * * * *